(12) United States Patent
Adams et al.

(10) Patent No.: US 7,457,617 B2
(45) Date of Patent: Nov. 25, 2008

(54) CMOS WIRELESS TRANSCEIVER WITH PROGRAMMABLE CHARACTERISTICS

(75) Inventors: Andrew R. Adams, Stanmore (AU); Neil H. Weste, Castle Hill (AU)

(73) Assignee: Cisco Technology, Inc., San Jose, CA (US)

( * ) Notice: Subject to any disclaimer, the term of this patent is extended or adjusted under 35 U.S.C. 154(b) by 118 days.

(21) Appl. No.: 11/470,330

(22) Filed: Sep. 6, 2006

(65) Prior Publication Data
US 2007/0004372 A1 Jan. 4, 2007

Related U.S. Application Data

(62) Division of application No. 10/095,504, filed on Mar. 11, 2002, now Pat. No. 7,120,427.

(60) Provisional application No. 60/322,416, filed on Sep. 14, 2001, provisional application No. 60/285,775, filed on Apr. 23, 2001, provisional application No. 60/283,609, filed on Apr. 13, 2001, provisional application No. 60/277,370, filed on Mar. 19, 2001.

(51) Int. Cl.
*H04M 3/00* (2006.01)
(52) U.S. Cl. ............... 455/418; 455/76; 455/86; 455/87; 455/251.1; 375/238; 375/376
(58) Field of Classification Search ............... 455/418, 455/76, 86, 87, 251.1; 375/238, 376
See application file for complete search history.

(56) References Cited

U.S. PATENT DOCUMENTS

| | | | |
|---|---|---|---|
| 5,377,133 A | 12/1994 | Riggle et al. | 708/524 |
| 5,596,604 A | 1/1997 | Cioffi et al. | 375/260 |
| 5,792,956 A * | 8/1998 | Li | 73/660 |
| 6,130,922 A | 10/2000 | Stott et al. | 375/344 |
| 6,137,372 A | 10/2000 | Welland | 331/117 R |
| 6,175,279 B1 * | 1/2001 | Ciccarelli et al. | 330/296 |
| 6,509,799 B1 * | 1/2003 | Franca-Neto | 330/305 |
| 6,615,388 B1 | 9/2003 | Takamichi | 714/795 |
| 6,680,980 B1 | 1/2004 | Ashley et al. | 375/265 |
| 6,680,986 B1 | 1/2004 | Hemmati | 375/341 |
| 6,765,977 B1 | 7/2004 | Adams et al. | 375/376 |
| 6,968,167 B1 * | 11/2005 | Wu et al. | 455/251.1 |
| 7,054,296 B1 | 5/2006 | Sorrells et al. | 370/338 |
| 2002/0196595 A1 | 12/2002 | Ciancio | 361/93.1 |

OTHER PUBLICATIONS

Office Action for U.S. Appl. No. 11/278,239 mailed Dec. 3, 2007.

* cited by examiner

*Primary Examiner*—Sanh D Phu
(74) *Attorney, Agent, or Firm*—Dov Rosenfeld; Inventek

(57) ABSTRACT

A monolithic radio integrated circuit includes a substrate, a set of one or more analog subcircuits on the substrate, a programmable bias current supply on the substrate coupled to the set to provide bias currents to the analog subcircuits of the set including programmable bias currents to one or more analog subcircuits forming a first subset of the set, and a digital subsection coupled to the programmable bias supply to determine the bias currents supplied to the analog subcircuits of the first subset, such that one or more characteristics of the radio integrated circuit are modifiable by programming the programmable bias supply.

45 Claims, 7 Drawing Sheets

CMOS WIRELESS TRANSCEIVER WITH PROGRAMMABLE CHARACTERISTICS

RELATED PATENT APPLICATIONS

This invention is a division of U.S. patent application Ser. No. 10/095,504 filed Mar. 11, 2002, to inventors Adams et al., titled CMOS WIRELESS TRANSCEIVER WITH PROGRAMMABLE CHARACTERISTICS, having Attorney/Agent Ref. No. CISCO-5226. The contents of such U.S. patent application Ser. No. 10/095,504 are incorporated herein by reference.

This invention claims priority of the following U.S. provisional patent applications:

Ser. No. 60/277,370 entitled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH, filed: Mar. 19, 2001, Attorney/Agent Ref. No.: CISRAD-100-P.

Ser. No. 60/283,609 entitled WIRELESS COMMUNICATION SYSTEM, filed: Apr. 13, 2001, Attorney/Agent Ref. No.: CISCO-4502-P.

Ser. No. 60/285,775 entitled METHOD AND APPARATUS FOR REDUCING OSCILLATOR PULL IN A CMOS WIRELESS TRANSCEIVER INTEGRATED CIRCUIT, filed: Apr. 23, 2001, Attorney/Agent Ref. No.: CISCO-4487-P.

Ser. No. 60/322,416 entitled CMOS WIRELESS TRANSCEIVER WITH PROGRAMMABLE CHARACTERISTICS, to Adams et al., filed: Sep. 14, 2001, Attorney/Agent Ref. No.: CISCO-4640-P Such provisional patent applications are incorporated herein by reference.

BACKGROUND

This invention is related to wireless devices, and in particular to providing programmable performance and power characteristics in complementary metal oxide semiconductor (CMOS) integrated circuits for radio applications in order to reduce power consumption and increase yield.

Integrated circuit devices are omnipresent nowadays and used for both analog and digital functions, often on the same device. Metal oxide semiconductor (MOS) technology, in particular CMOS technology is well established for digital applications and offers many advantages over other technologies.

As is common, the term integrated circuit, IC, and chip shall be used throughout this specification to refer to an integrated circuit.

The use of CMOS in analog circuits, e.g., high frequency radio circuits has been limited for many reasons. One reason is the difficulty in realizing accurate circuits using CMOS technology. Another problem has been the low yields obtainable from devices operating near the high frequency limits of the process. Another has been process variation of the CMOS process. Another has been transistor behavior with temperature. It would be advantageous to have a CMOS chip that is tunable so that more chips are usable for a given CMOS process. It would be advantageous to have a CMOS chip that is tunable to account for the variation of transistor behavior with temperature.

Different radio applications require a different level of performance, and different levels of performance result in different power consumption. Some applications may require very low levels of power consumption, while in other applications, the performance is paramount. Traditionally, a chip vendor may design and offer different chips for these different applications: a low power chip for low power applications, and a high performance chip for high performance applications. It would be advantageous to have a single chip that can be used for both low power and high performance applications. Using the same chip would allow economies of scale to lower the cost of each chip.

Thus there is a need for a CMOS radio chip that is tunable so that more chips are usable for a given CMOS process. There further is a need for a CMOS radio chip that is tunable to account for the variation of transistor behavior with temperature.

One wireless application that is becoming more widespread is that of wireless local area networks (WLANs). IEEE 802.11 is a standard for wireless local area networks, and IEEE 802.11a is a WLAN standard for communicating in the 5 GHz region. There thus is a need for inexpensive radio chips suitable for use with IEEE 802.11a. For more information on the IEEE 802.11 and IEEE 802.11a standards, see: ANSI/IEEE Std 802.11, 1999 Edition (ISO/IEC 8802-11:1999) Local and metropolitan area networks—Specific Requirements—Part 11: Wireless LAN Medium Access Control (MAC) and Physical Layer (PHY) Specifications, and IEEE Std 802.11a-1999 [ISO/IEC 8802-11:1999/Amd 1:2000(E)] (Supplement to IEEE Std 802.11, 1999 Edition) Part 11: Wireless LAN Medium Access Control (MAC) and Physical Layer (PHY) specifications: High-speed Physical Layer in the 5 GHz Band. The standards are available on the Internet at several locations, including from the IEEE (www.IEEE.org) and in particular at grouper.ieee.org/groups/802/11/index.html.

SUMMARY

One embodiment described herein is a monolithic radio integrated circuit that includes a substrate, a set of one or more analog subcircuits on the substrate, a programmable bias current supply on the substrate coupled to the set to provide bias currents to the analog subcircuits of the set including programmable bias currents to one or more analog subcircuits forming a first subset of the set, and a digital subsection coupled to the programmable bias supply to set the bias currents supplied to the analog subcircuits of the first subset, such that one or more characteristics of the radio integrated circuit are modifiable by programming the programmable bias supply.

In one embodiment, the subcircuits comprise MOS transistors. In one version, the MOS transistors are in a CMOS configuration.

DETAILED DESCRIPTION

The Wireless Network

Figure 1:
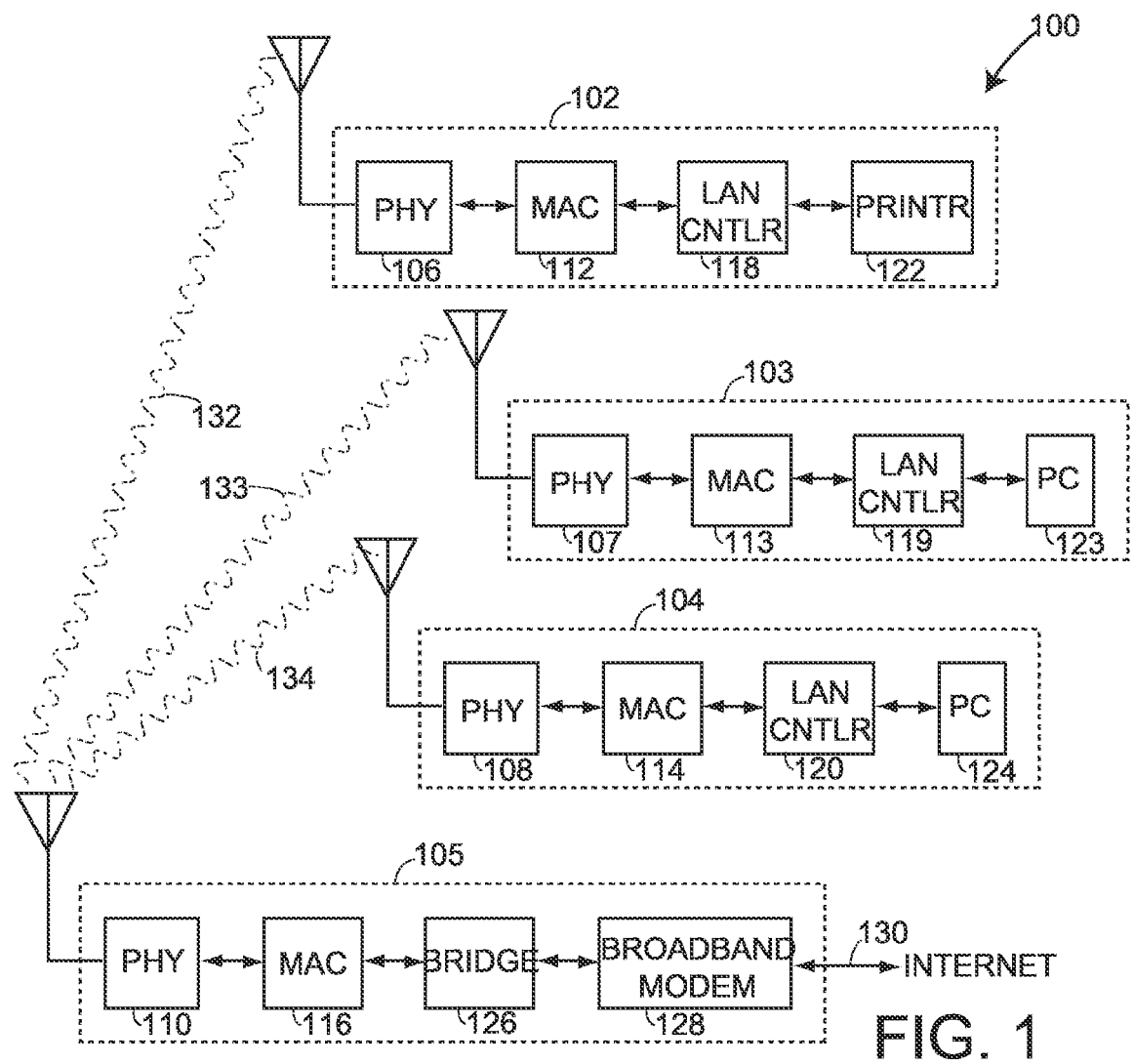
FIG. 1 is a functional block diagram of a wireless communication system embodiment of the present invention.

FIG. 1 diagrams a wireless computer data network in which embodiments of the present invention may be used, and is referred to herein by the general reference numeral 100. The network 100 includes a plurality of wireless appliances represented by units 102, 103 and 104, and may also include at least one base station connected to the Internet, e.g., represented here by a base station 105. One or more of the wireless appliances may be mobile. Network 100 preferably operates according to industry networking standards. For example, the IEEE-802.11 standard defines protocols for two types of networks, ad-hoc and infrastructure networks. An ad-hoc network is a simple network where communications are established between multiple stations in a given coverage area without the use of an access point or server. An infrastructure network uses an access point to coordinate communication between all stations in the WLAN, and allows for both fixed and mobile stations. The access point also is used to handle traffic from the WLAN to the wired or wireless backbone, e.g., an intranet or the Internet.

The license-free national information structure (U-NII) radio spectrum bands in the United States are assigned to 5.15-5.25, 5.25-5.35, and 5.725-5.825 GHz, and are preferred for use in the network 100 for wireless ad-hoc LAN communication. The IEEE-802.11a protocol includes a training sequence built on a preamble that provides sufficient information to allow frequency and timing estimation as well as channel estimation to enable a receiver to lock-on to the carrier and allow data demodulation. All transmissions occur in bursts, so the receivers must find lock each time a burst commences.

A physical layer interface (PHY) 106, 107, 108, and 110, provides each of the wireless interconnections. A media access controller (MAC) 112, 113, 114, and 116, provide the next interface layer in a layered communications model. A local area network controller 118, 119, and 120 is provided as a peripheral to a personal computer (PC) 123, 124 and, in this example, a printer 122. The PCs can be computer workstations and laptops that belong to employees in a business environment, and even to individuals in their homes. In one application, the base station 105 is installed in a hotel and the other units 103 and 104 are independent guests who have checked-in and are allowed to access the Internet as part of their room charges. Unit 102 can be a printer. Other applications include inventory control, shipment tracking, immediate-area advertising, security access, night-watchman station checking, weapons stockpile verification, etc.

A bridge 126 interfaces the local area network through a broadband modem 128 to the Internet 130. The broadband modem 128 can be implemented with DSL, ISDN, or even two-way satellite connections like Starband (www.starband.com).

A plurality of radio communications, represented by radio links 132, 133, and 134, preferably use forty-eight active tones and four pilot tones in a 64-tone FFT coded orthogonal frequency division multiplexing (coded OFDM, also known as COFDM), and quadrature phase shift keying (QPSK). The modulated signals are transmitted in the five GHz frequency band. Other modes can also be used, e.g., 16QAM and 64QAM. Such are described in detail in the IEEE-802.11a standard (www.ieee.com). Note there also may be direct radio links between the units 122, 123, and 124.

Figure 2:
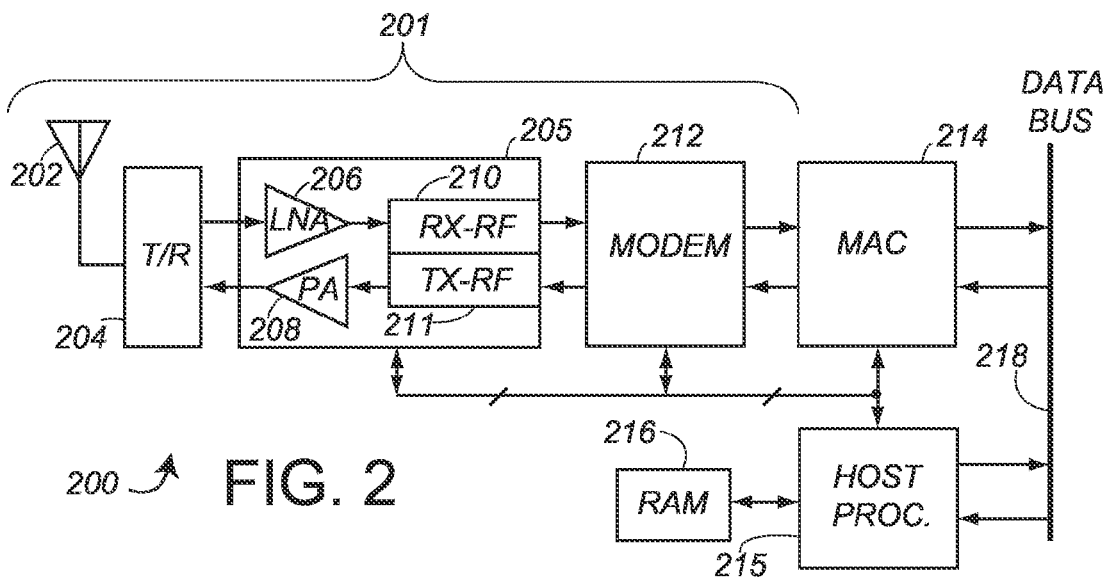
FIG. 2 is a functional block diagram of a wireless communication system 200 that includes an embodiment of the transceiver of the present invention.

FIG. 2 is a functional block diagram of a wireless communication system 200 that includes an embodiment of present invention. The system 200 might be, for example, part of a PCMCIA wireless LAN card embodiment, and includes a physical layer interface (PHY) 201 that includes at least one antenna 202 for 5 G Hz carrier service, a transmit/receive (T/R) switch 204 for half-duplex operation, and a wireless transceiver 210 such as that of FIG. 2 or FIGS. 4 that includes a low-noise amplifier (LNA) 206, a power amplifier (PA) 208, other radio frequency (RF) receive components (RX-RF) 210, and other radio frequency (RF) transmit components (RX-RF) 211. One embodiment uses a plurality of antennas to provide antenna diversity. The physical layer also includes a data modem 212 to handle the coding and modulation, and demodulation and decoding for the transceiver 205. The system 200 further includes a media access controller (MAC) 214 for layer-2 processing. A computer system databus 218 is accommodated. Interfaces may be included e.g., one or more interfaces that conform to well-known industry standards PCMCIA, PCI, USB, and so forth.

One optional component is a host processor 215. The host processor function may, for example be incorporated with the MAC 214. A random access memory (RAM) 216 is included for data buffering and program storage. The RAM 216 may be directly coupled to the host or to the MAC or to both.

In addition to the radio data between the modem, radio, and MAC, control information such as gain settings for the radio from an automatic gain control module in the modem, and other data, may be communicated between the host (if included), the MAC, the modem and the wireless transceiver.

In one embodiment, the system 200 is implemented to be compatible with the IEEE-802.11a standard for WLAN applications. The RF transceiver 205 and modem 212 constitute a complete wireless engine for OSI Layer-1 physical layer (PHY) functionality in broadband wireless LAN's. The MAC 214 is IEEE-802.11-compliant for layer-2 processing. Supportable data rates have been tested to exceed 54 Mbits/second (Mbps).

Given the present state of semiconductor technology development, the system 200 is preferably constructed on a single printed circuit board (PCB) and the RF transceiver 205 and modem 212 are each implemented with CMOS technology in individual integrated circuits. The present inventors have discovered that 0.25-micron CMOS technology is practical for use in implementations of the modem 212.

One aspect of the invention is to increase the yield obtained using such CMOS technology for the transceiver 205. One embodiment uses 0.18-micron CMOS technology for the RF transceiver 205. One such silicon foundry that has the capability to manufacture such parts is Taiwan Semiconductor Manufacturing Co., Ltd.

The Modem

Figure 3:
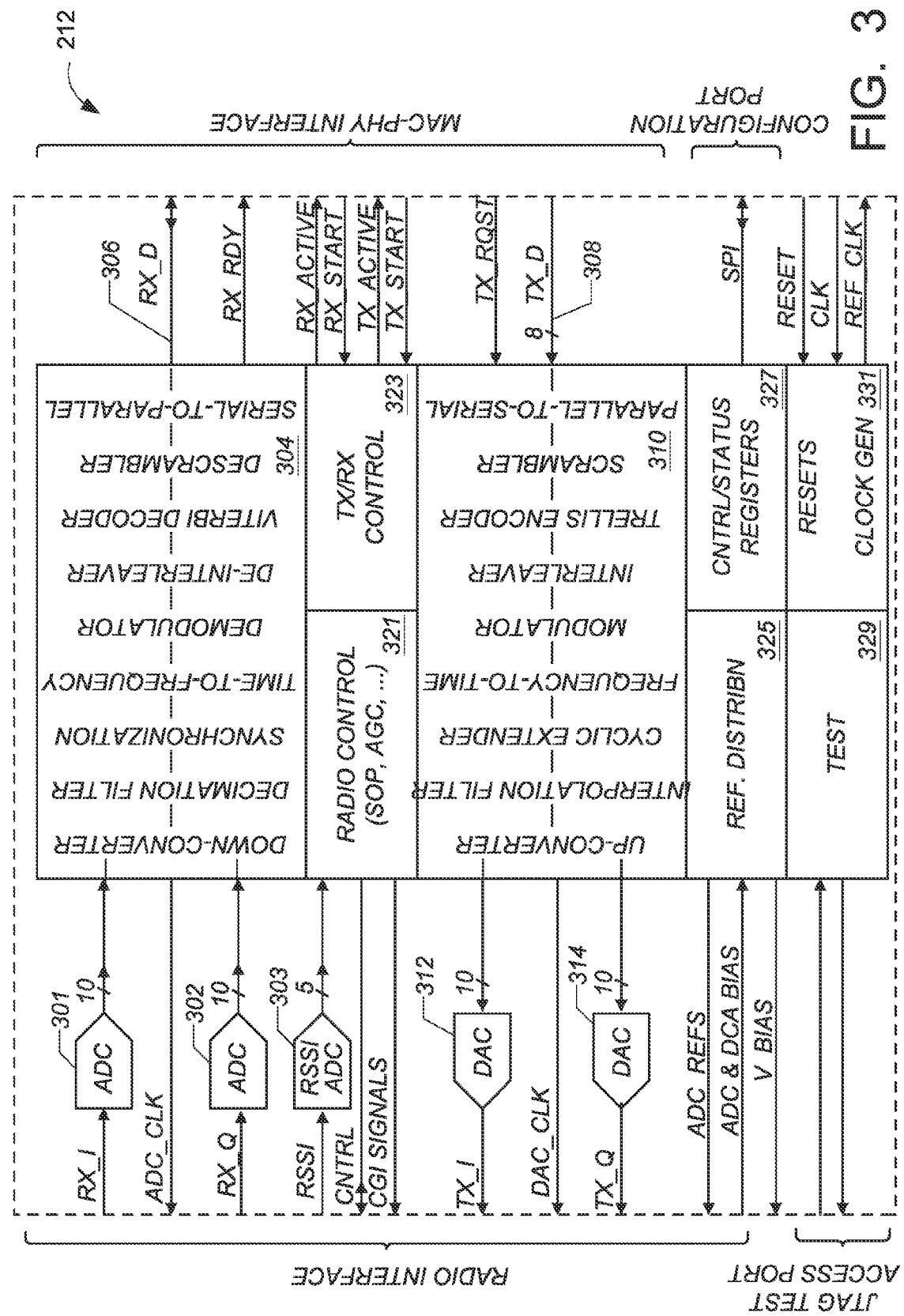
FIG. 3 shows a block diagram of a modem integrated circuit that can operate with an embodiment of the transceiver of the present invention.

FIG. 3 shows in simplified block diagram form a modem chip 212 that can operate with the transceiver 205. ADCs 301 and 302 accept fully differential I and Q analog signals from one embodiment of the transceiver chip and these are sampled at 40 Ms/s by the ADCs. Another version works with a bandpass IF transceiver with real bandpass IF differential output centered at 20 MHz. The analog input from the transceiver chip in such a case is sampled at 80 Ms/s by one ADC and an internal IQ down-converter in processor 304 generates baseband I and Q channel outputs.

The receive signal processor 304 accepts the digitized receive signals from ADCs 301 and 302 and carries out the following operations: down-conversion, anti-alias filtering, OFDM symbol synchronization, time-to-frequency conversion, sub-carrier demodulation, de-interleaving, Viterbi decoding, descrambling, and serial-to-parallel conversion. The output 306 of the receive processor 304 goes to an off-chip MAC processor.

In one embodiment, the transmit and receive data paths in modem 212 are completely independent, allowing full-duplex as well as half-duplex operation.

One modem chip version is only for implementation with a bandpass IF radio, so that only a single differential ADC, rather than the two ADCs 301 and 302 shown in FIG. 3 is included for the receive path. The analog input from the transceiver chip is sampled at 80 Ms/s by that ADC and an internal IQ down-converter in processor 304 generates baseband I and Q channel outputs. The decimating filters are configured as a 4:1 decimating low-pass filters.

The to-be-transmitted signal 308 from the MAC is input to a transmit processor 310 that performs parallel-to-serial conversion, scrambling, encoding, bit-interleaving, sub-carrier modulation, OFDM time symbol generation, cyclic extension, filtering and up-conversion. The resulting digital signals are converted to analog I- and Q-signals by digital-to-analog converters 312 and 314. These analog signals are input to the transceiver chip.

Operation of the modem 212 is controlled and monitored by a set of 48 16-bit control and status registers that are accessed via a 4-pin Serial Peripheral Interface (modem SPI).

The radio is controlled by radio control block 321 that includes start-of-packet detection and automatic gain control for dynamically setting the gains and the performance of the transceiver. The receive and transmit functions of the modem are controlled by an RX/TX control block 323 that both provides controlling the function of the modem under control of the off-chip MAC controller and that provides control signals to the off-chip MAC controller.

The Radio Transceiver

Figure 4A:
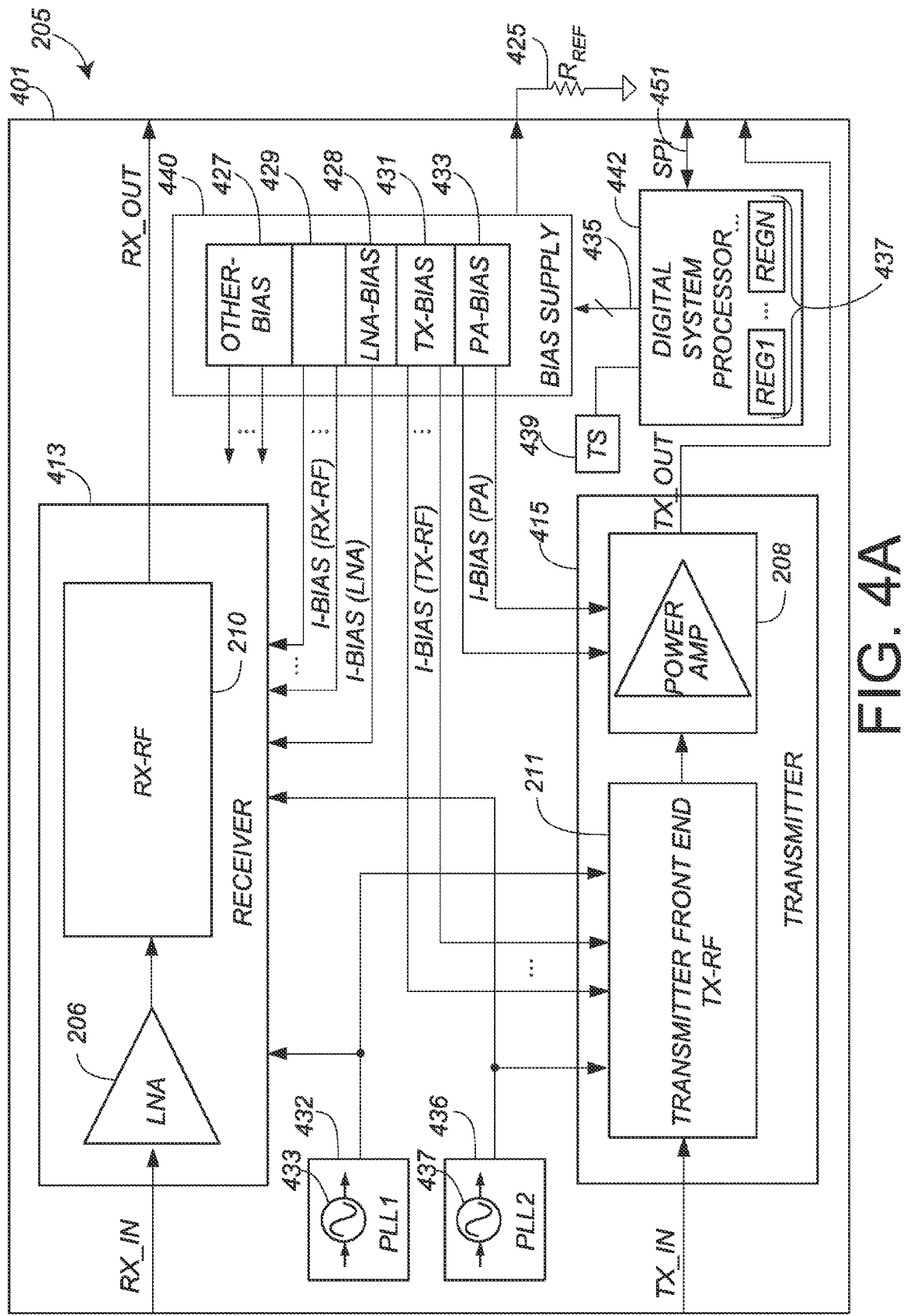
FIG. 4A shows in simplified form a superheterodyne transceiver integrated circuit (chip) that includes a bias supply and a digital system controller in accordance with an embodiment of the invention.

FIG. 4A shows in block diagram form a radio transceiver monolithic integrated circuit 205 that includes a substrate 401 and first set of analog subcircuits on the substrate forming a receiver subsystem 413 and a second set of analog subcircuits on the substrate forming a transmitter subsystem 415. The receiver subsystem includes a low-noise amplifier 206 that in one embodiment may be switched out of the circuit. The receiver subsystem further includes the receiver RF electronics 210 that converts the received radio signals to baseband or to an IF signal for further processing by the modem, depending on the particular configuration. The transmitter subsystem 415 further includes a transmitter front-end 211 and a power amplifier subsystem 208. The receiver RF electronics 210 and transmitter front-end 211 are each in a two-stage superheterodyne configuration that includes two mixers requiring two oscillator signals. PLL1 (432) and PLL2 (436) are on-chip oscillators—e.g., phase-locked loop synthesizers—that generate local oscillator signals for the two mixers that are included in each of receiver subsystem 413 and transmitter front-end 211. In one embodiment, each of PLL1 and PLL2 includes a voltage-controlled oscillator (VCO) 433, 437, respectively, and a phase error detector. In one embodiment, one or more intermediate frequency (IF) filters for the receiver RF electronics 210 and for the transmitter front-end 211 are off-chip. The oscillators 432 and 436 are on-chip.

In one embodiment, transceiver 205 is for half-duplex operation with mutually exclusive receive and transmit periods. In one implementation, transceiver 205 is for operation in a WLAN, for example a WLAN conforming to the IEEE 802.11 medium access control (MAC) specification, and in particular, a WLAN conforming to the 802.11a WLAN specification.

Radio transceiver 205 includes a power supply that has a bias current supply 440 that supplies bias current to the receiver LNA 206 and RF electronics 210, to the transmitter front-end 211, to the power amplifier subsystem 208, and to other subcircuits.

The transceiver further includes a digital subsection that in one embodiment has a processor. Processor 442 is a digital circuit that in one embodiment is on the same substrate as the receiver subsystem 413 and transmitter 211, and that includes a set of one or more—say N—registers 437, a microcontroller, called the RAD16 herein, and a system processor interface (transceiver SPI) 451. The transceiver SPI, also referred to as the transceiver configuration port, provides access to the set of registers 437, and in one embodiment, is a serial port.

The digital system processor 442 provides a set of bias control signals to the bias supply. Current bias supply 440 includes a bias current supply 429 (RX-BIAS) that supplies one or more bias lines to the receiver RF electronics 210, a bias current supply 428 (LNA-BIAS) that supplies one or more bias lines to the receiver low noise amplifier 206, a bias current supply 431 (TX-BIAS) that supplies one or more bias lines to the transmitter front-end 211, a bias current supply 433 (PA-BIAS) that supplies one or more bias lines to the power amplifier subsystem 208, and a bias current supply 427 that supplies one or more bias lines to other subcircuits. In one embodiment, the bias supply 440 includes a main bias generator that provides bias currents in units that are defined by an external reference resistor $R_{REF}$ 425. Selecting different values for $R_{REF}$ 425 is one mechanism for providing for different DC power levels.

The power amplifier bias current supply 433 includes a first current modulator to control the rate of change of supplied bias current in response to a TX_ON signal such that any perturbations to the frequencies of oscillators 432 and 436 are limited. In one embodiment, the receiver bias current supply 429 of current bias supply 440 includes a receiver current modulator to control the rate of change of supplied bias current in response to an RX_ON signal to further limit any perturbations to the frequencies of oscillators 432 and 436. In one embodiment, the transmit front-end bias current supply 431 of bias current supply 440 further includes a transmitter current modulator to control the rate of change of supplied bias current also in response to the TX_ON signal to even further limit any perturbations to the frequencies of oscillators 432 and 436.

Figure 4B:
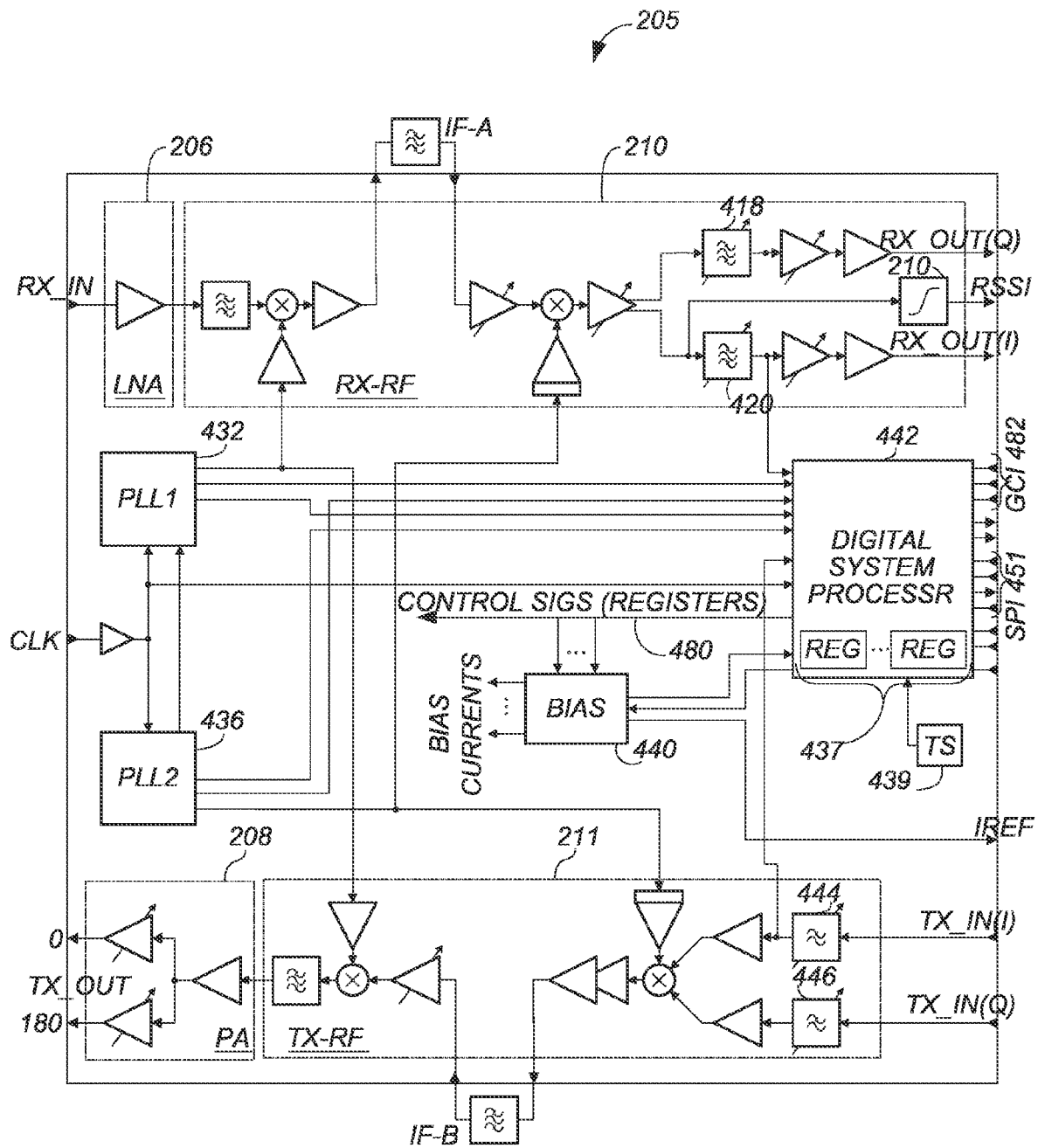
FIG. 4B shows the architecture of the transceiver chip of FIG. 4A in more detail.

FIG. 4B shows the internal architecture of one embodiment of the monolithic transceiver integrated circuit 205. In order not to unnecessarily obscure the present invention, various well-known structures and interfaces, secondary to the understanding of the invention, are not shown in the chip architectures of FIGS. 4A and 4B.

Radio transceiver 205 is substantially monolithic and in one embodiment, includes metal oxide semiconductor (MOS) circuitry, including CMOS analog and digital circuitry. In one embodiment, the analog subcircuits are CMOS subcircuits that operate at RF frequencies in the 5 GHz range and baseband frequencies up to 40 MHz. "Baseband" refers to the low-frequency input and output frequency bands, and includes bandpass IF signals. In one embodiment, the integrated circuit also includes digital subcircuits to provide control, status, and interface logic, including digital system processor 442.

Radio transceiver 205 also includes an on-chip temperature sensor 439 coupled to the processor 442. One embodiment of the transceiver chip includes an analog to digital converter (ADC) (not shown in FIG. 4B) and a set of one or more digital-to-analog converters (DACs—also not shown in FIG. 4B) that are used for test purposes.

In one embodiment, the same intermediate frequency is used in both the transmit front-end and the receiver subsystem.

The serial configuration port (transceiver SPI 451) provides external access to the registers and provides for on-the-fly adjustment of such parameters as the gains of some of the transmit and receive amplifiers and adjustment of the bias current generation parameters. The digital portion of the integrated circuit may further include PLL lock-detect filters, ADC and DAC control logic, and clock generation logic.

Figure 7:
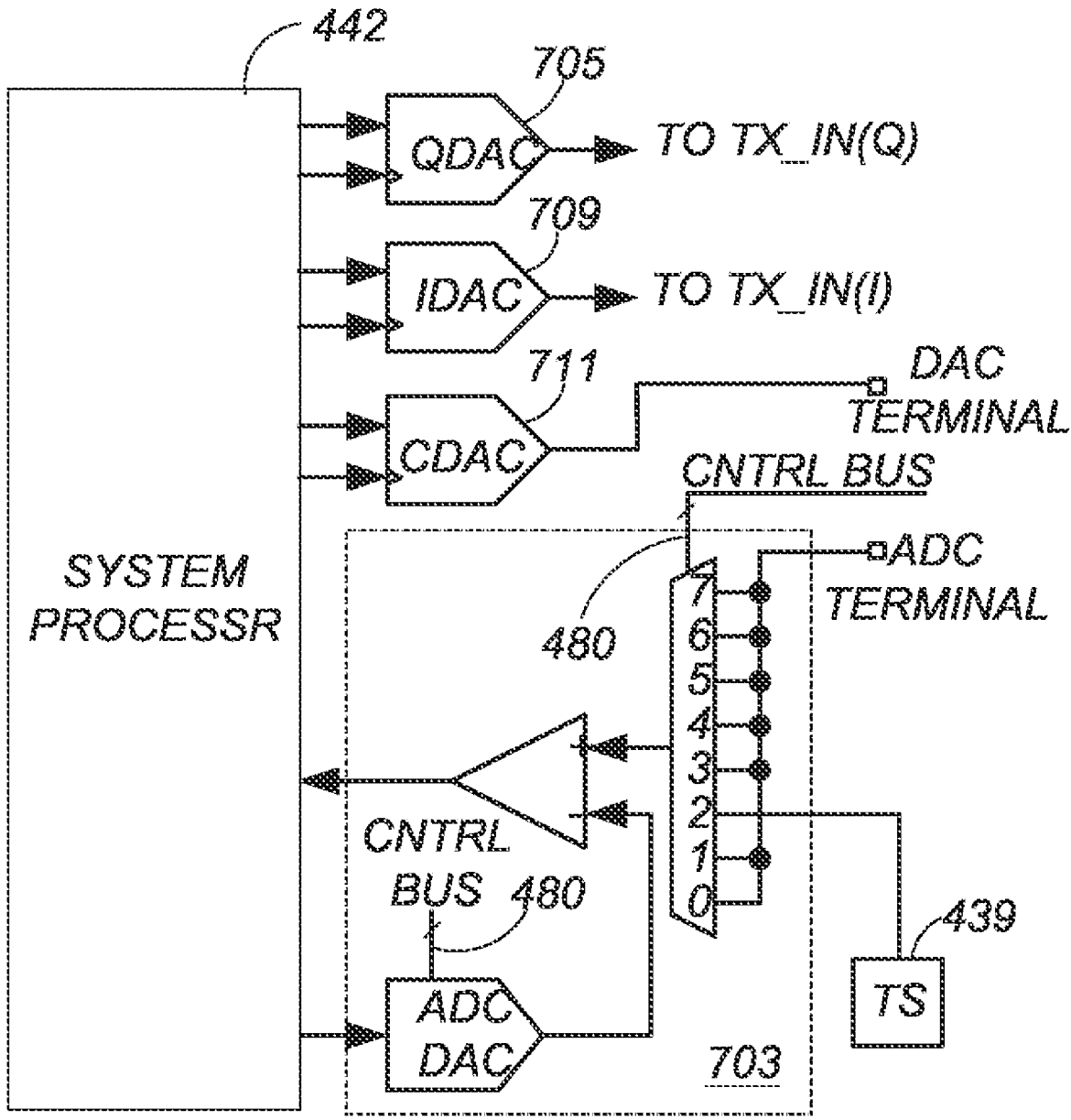
FIG. 7 shows the temperature sensor, an analog to digital converter and digital to analog converters included in one transceiver embodiment.

FIG. 7 shows the analog to digital converter 703 and the digital to analog converters 705, 709, and 711. The ADC 703 is a 6-bit successive approximation ADC and includes a selector that selects the input to the ADC to be either the output of the temperature sensor 439 or an input to an ADC terminal on the transceiver chip. Two registers in the register set 437 (FIG. 4) called the ADC control register and the ADC result register are used for the ADC. The selector selects the ADC input according to the value in some of the bits of ADC control register, and the ADC value is provided to the processor in the ADC value register.

A more detailed description of the operation of the elements shown in FIG. 4B is provided in above-mentioned U.S. provisional patent application Ser. No. 60/322,416, filed Sep. 14, 2001, Attorney/Agent Ref. No.: CISCO-4640-P, and incorporated herein by reference.

The transceiver 205 includes a transmitter front-end 211 that provides for quadrature (I and Q) input transmit signals, that, in one version, are differential signals. The I and Q signals for transmission are first filtered by a pair of tunable baseband filters 444 and 446. The receiver subsystem 413 includes quadrature (I and Q) baseband receive (output) signals that, in one version, are differential signals. In another embodiment, the receiver subsystem 413 includes a single baseband receive signal output rather than quadrature receive signals, and such an embodiment is similar to that shown in FIG. 4B, but with only a single output generated on-chip from the I and Q signals.

The transmitter front end 211 includes a first up-converter driven by a 580-880 MHz signal obtained by frequency dividing the output of the synthesizer PLL2 436 output—in one embodiment, 2.32-3.52 GHz—by 4. In one embodiment, the IF up-converter contains a quadrature mixer and a filter to reject high-order mixer image products. The up-converter drives a preamplifier and IF output buffer that drives an external IF filter (IF-B). The output of the external IF filter feeds an IF input variable gain amplifier (VGA). In one implementation, the gain of VGA is adjustable using parameters entered via the transceiver SPI 451. The VGA drives the IF input of a second up-converter: an RF up-converter. The oscillator input of the RF up-converter is driven by the output signal of synthesizer PLL 1 432—in one embodiment, 4.41-4.55 GHz. In one embodiment, the RF up-converter contains a mixer and includes a filter to reject unwanted mixer image products. The up-converter is followed by an RF bandpass filter that further suppresses unwanted images and that drives a RF power amplifier driver that in turn drives the power amplifier subsystem 208. In one embodiment, two power amplifiers are included in the power amplifier subsystem 208 to produce complementary output signals in the frequency range 5.15-5.35 GHz. The two power amplifiers each have independent bias current control so that if a single-ended output only is required, one of the power amplifiers can be turned off to conserve power. In one embodiment, the gain of the power amplifiers is adjustable using parameters entered via the transceiver SPI 451.

One embodiment of the receiver subsystem 413 is now described in more detail. The input to the receiver subsystem drives a differential-input RF low-noise amplifier (LNA) 206 that operates over an input frequency range of 5.15-5.35 GHz. In one embodiment, bypassing the LNA 206 is possible by setting a bit entered via the transceiver SPI 451, and such bypassing reduces the receive gain. The LNA 206 is followed by the receiver RF electronics subsystem 210 that includes an integrated image reject filter to feed the RF input of an RF down-converter. The RF input is mixed in the RF down-converter with a buffered signal from synthesizer PLL1 432 operating at 4.41-4.55 GHz to produce an intermediate frequency range of 580-880 MHz. The down-converter is followed by an IF output buffer that drives an external IF filter IF-A. For relatively high performance applications, the external IF filter is a surface acoustic wave (SAW) device. In other less-demanding applications, a relatively simple LC filter may be used for the IF filter. The output of the external IF filter feeds an IF input VGA, whose gain is adjustable using parameters that may be input via the transceiver SPI 451. The IF VGA feeds the IF input of an IF down-converter that has as its oscillator signal a version of the PLL2 signal (2.32-3.52 Ghz) divided by four to produce 580-880 MHz. In one embodiment, the IF down-converter contains a quadrature mixer that generates in-phase (I) and quadrature-phase (Q) output signals. In one embodiment, a single baseband output preamplifier is provided for a single output generated from the I and Q signals. In another embodiment shown in FIG. 4B, a preamplifier is provided for both the I and Q outputs. The IF down-converter I and Q outputs feed a baseband coarse-step VGA pair. The gains of the coarse-step VGAs are adjustable in relatively coarse steps using parameters entered via the transceiver SPI 451. The coarse-step VGAs drive tunable baseband filters 418, 420 that provide further rejection of mixer image products and, in one embodiment, may be bypassed by setting a bit entered via the transceiver SPI 451. In a single-sideband embodiment, only one filter is provided and the filter is a bandpass filter, 10-30 MHz in one embodiment. In another embodiment, the tunable baseband filters are lowpass filters, 0-20 MHz in one version. These baseband filters not only may be bypassed, but in one embodiment, are tunable. The outputs of the baseband filters drive fine-step VGAs, each of which in turn drives one of two output buffers. The gains of the fine-step VGAs are adjustable in relatively fine steps via parameters entered via the transceiver SPI 451. The I-channel coarse-step VGA also drives a logarithmic detector/amplifier 430 that allows received signal strength indication (RSSI) measurements to be made.

The set 437 of registers in system processor 442 also includes:

A receiver baseband filter tuning register for the receiver baseband filters 418, 420.

A receiver baseband filter control register for selecting, bypassing and resetting the receiver baseband filters 418, 420 and for selecting the common mode voltage for the baseband components in the receiver subsystem 415.

A receiver gain control register for bypassing or not the LNA 206 and setting the gains of the IF amplifier, and coarse step and fine step variable gain amplifiers.

A transmitter baseband filter-tuning resister for tuning the transmit baseband filters 444, 446.

A transmitter baseband filter control register for selecting, bypassing and resetting the transmitter baseband filters 444, 446, and for selecting the common mode voltage for the baseband components in the transmit front end 211.

A transmitter gain control register for setting the gains of the transmit IF-amplifier and the power amplifiers of power amplifier subsystem 208.

The set 437 of registers in system processor 442 further includes:

Status registers.

Ramp generator registers for setting the characteristics of the modulation of the receiver and transmitter turn-on and turn-off bias current modulation.

ADC registers.

IDAC and QDAC registers.

CDAC registers.

Power amplifier mode registers that include a three bits power mode select value for selecting the mode, and 8 sets of power amplifier bias controls, one for each of eight power amplifier modes that are selected according to the value of the power mode select value.

Bias control registers for setting the bias of subcircuits in the transceiver.

Processor control and interrupt registers for defining the start address for the RAD16 microcontroller in processor 422 and for enabling interrupts, for providing branch addresses for interrupts and for selecting how interrupts are sensed. One of the interrupt conditions is an ADC flag that sets an interrupt when a signal called comp_out is set. Signal comp_out is set when the analog input supplied to the ADC is greater than some digital value, e.g., some estimate, otherwise signal comp_out is not set.

Processor registers for the RAD16 microcontroller such as an accumulator, a program counter, an address register, a data output register, a data input register, an instruction register, data read/write memory (RAM) and Instruction RAM, and instruction ROM.

The transceiver also includes a gain control interface (GCI) 482 that inputs gain parameters to the digital system processor for setting gains, and that is used, for example, by automatic gain control (AGC) logic in the radio controller (MODEM 212) to dynamically adjust transceiver receive path gain to optimize the received signal to noise ratio. The GCI 482 also provides a mechanism for controlling the transceiver transmit power level by selecting from one of nine configurations for the power amplifier subsystem 208. The three inputs in the GCI 482 are GCl_CSn, a gain control port chip select input, GCl_CLK, a gain control port clock, and GCl_DATA, the gain control port data input.

The GCI data is loaded into one of three further registers included in the transceiver: the GCI receiver register, the GCI transmitter gain register, or the GCI PA mode register. These registers control the variable gain blocks in the transmit and receive paths when a GCI enable bit is set. Otherwise, the registers set the signal path gains.

A control bus 480 is used to communicate control signals from the registers in register set 437 in the digital system processor 442 to various subcircuits of the transceiver for the purpose of setting several characteristics of the transceiver. In one embodiment, the control bus is used to send control signals to the programmable bias supply 440. The control bus 480 is further used to set the gains of the variable gain amplifiers in the receiver subsystem, and to switch in or out the receiver LNA 206. The control bus 480 is also used to send signals from the system processor to set the gains of the transmitter variable gain amplifiers and the power amplifiers in power amplifier subsystem 208. Furthermore, the control bus 480 is also used to send signals from the system processor to set the characteristics of the receiver baseband filters 418, 420 and the transmitter baseband filter 444, 446.

According to one embodiment, processor 442 includes a RAM for instructions, a RAM for data, and a ROM for instructions for the RAD16 microcontroller. In one embodiment, the microcontroller in processor in 442 is a 16-bit accumulator-based processor. The instruction set for the microcontroller includes arithmetic instructions, logical instructions, shift instructions, bit set and test instructions, load instructions, store instructions, memory instructions, jump instructions, return instructions, and some other instructions.

The Bias Supplies

Figure 5A:
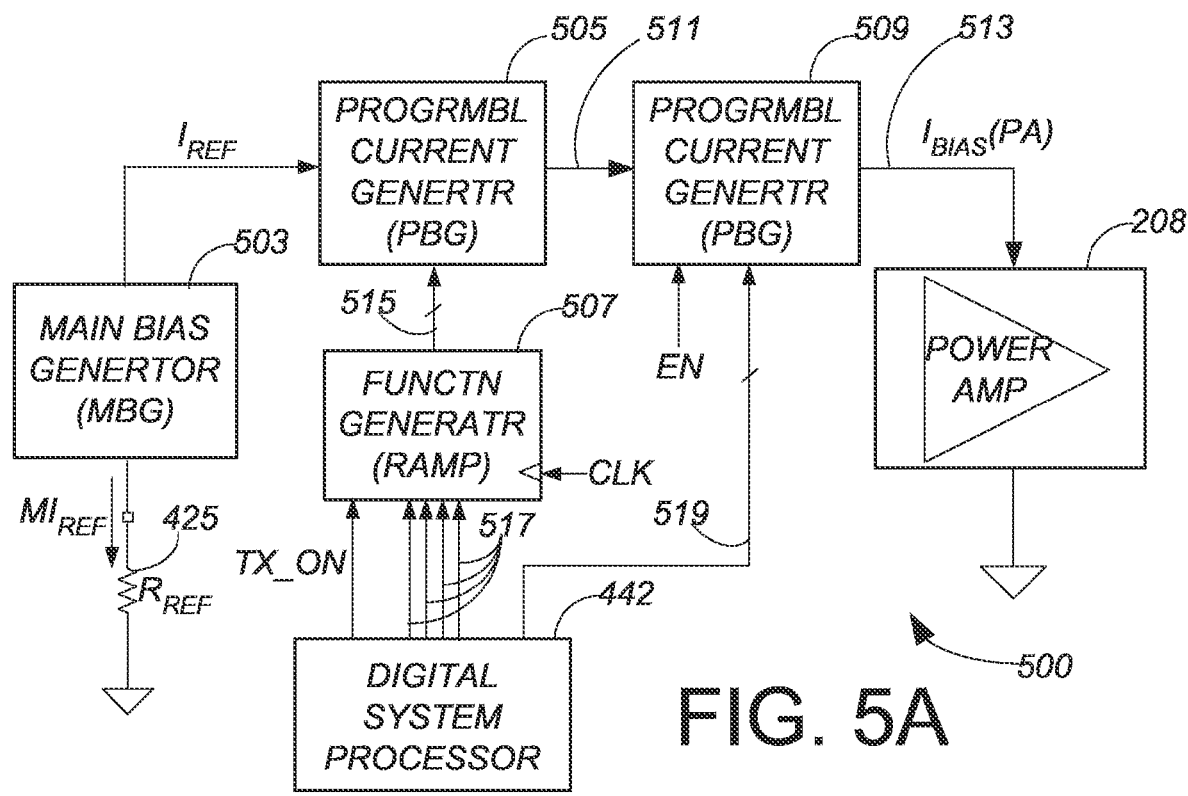
FIGS. 5A and 5B each shows a two-stage bias current supply.

FIG. 5A shows an embodiment 500 of the power amplifier bias current supply 433. This embodiment includes a main bias generator (MBG) 503 that provides a reference current $I_{REF}$. In one embodiment, the MBG 503 includes a current generator that supplies a current (shown as $M \cdot I_{REF}$) determined by the value of the external reference resistor $R_{REF}$ 425 followed by a current dividing current mirror circuit that divides the current by an integer M into current $I_{REF}$. This current $I_{REF}$ is used by a first programmable bias current generator (PBG) 505 to generate a bias current 511 which is a multiple of the current $I_{REF}$. PBG 505 is referred to as a master PBG. In one embodiment, master PBG 505 includes a digital signal input 515 that determines the $I_{REF}$ multiple, and which is a function of time. A function generator 507 provides the time varying digital signal 515 according to a TX_ON signal that indicates when the transmitter is being turned on, and a set of parameters 517. In one embodiment, master PBG 505 includes a digital to analog converter (DAC) having a current output, with the DAC having digital signal 515 as input.

In one embodiment, the modulated bias current 511 is supplied directly to the analog power amplifier subsystem 208. In another embodiment, the modulated bias current 511 is fed to another programmable bias generator 509, referred to as a slave PBG. Slave PBG 509 is controlled by a digital signal 519 from the digital system processor and sets the maximum bias current for the power amplifier subsystem 208. Having this maximum power setting programmable enables the transceiver 205 to operate with different power and performance levels. In one embodiment, slave PBG 509 also includes an enable (EN) input that if not set disables the current output of PBG 509.

As described in above-referenced U.S. patent application Ser. No. 60/285,775, the current modulation provided by function generator 507 is to limit the rate of change of current following the signal TX_ON indicating that the power amplifier subsystem 208 is to be turned on or off such that perturbations to the oscillators (PLL1 and PLL2) are limited. In one embodiment, the modulation is a ramp function.

One embodiment includes a selector (not shown) coupled to and between the function generator 507 and the master PB 505. The selector has an enable input that provides a further enabling mechanism to enable/disable modulation of the bias current. The output of the function generator is coupled to the input of the selector, and the output of the selector is coupled to the input of the master bias generator 505. The enabling/disabling is under control of the digital system processor 442. When disabled, the master PBG 505 produces maximum output gated by the TX_ON signal.

Figure 5B:
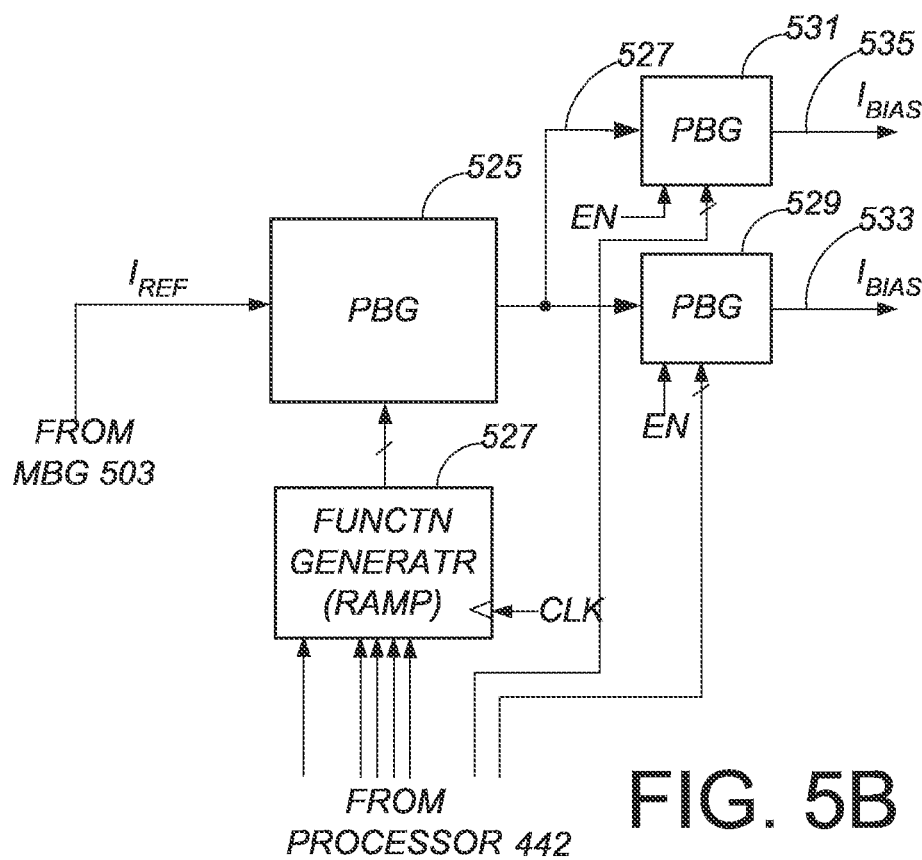

FIG. 5B shows an additional bias supply. In one embodiment in which the receiver bias current supply 429 of current bias supply 440 includes the receiver current modulator and in which the transmit front-end bias current supply 431 of current bias supply 440 includes the transmitter current modulator, each of the receiver and transmitter current modulators may have a structure similar to that shown in FIG. 5B. The current modulator shown in FIG. 5B generates two bias currents 533 and 535, each having a maximum bias current value individually set by an associated slave programmable bias generator (slave PBG 529 and slave PBG 531, respectively). Other embodiments may have any number of slave PBGs and bias current outputs, each such output to a subcircuit. The turn on and turn off of each of these are modulated using a function generator 527 that provides a modulating signal to a master programmable bias generator 525 in response to signals to turn on or off one or more subcircuits being supplied. The one master PBG drives all slave PBGs.

Figure 6:
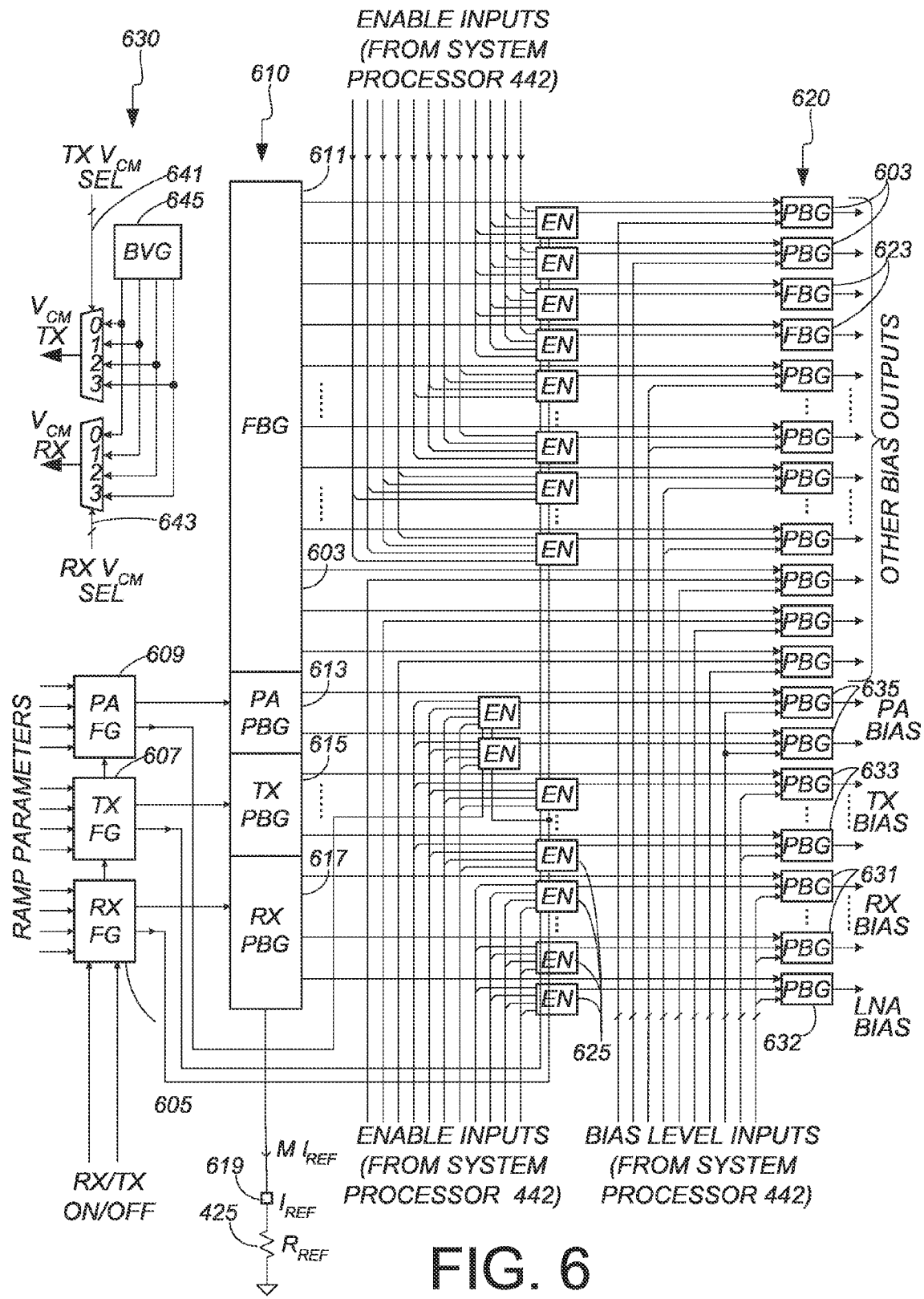
FIG. 6 shows a programmable bias current supply that includes control of the bias currents that are applied to sets of subcircuits according to one embodiment of the invention.

FIG. 6 shows an embodiment of the bias current supply system 440 that also includes a common mode voltage supply 630. The maximum values of the bias currents are controlled by a set of slave programmable bias current generators (PBGs) 603 via the transceiver SPI 451. Each slave PBG 603 is similar to the slave PBG 509 of FIG. 5A. Three digital programmable function generators RX-FG (605), TX-FG (607) and PA-FG (609) independently control the switch-on and switch-off bias current ramps for the receiver subcircuits, the transmitter front end subcircuits, and the transmit power amplifier subcircuits, respectively. The function generators are each similar to the function generator 507 shown in FIG. 5A. In one embodiment, each of function generators 605, 607, and 609 is a programmable digital ramp generator controlled by four ramp parameters input from the digital system processor 442. In one embodiment, each of the three function generators provides an additional digital trigger output, RX_is_on, TX_is_on, and PA_is_on, respectively, to indicate that bias current is being supplied to the power amplifier(s), transmitter front-end subcircuits, and receiver subsystem subcircuits, respectively.

In one embodiment, the bias current supply system 440 includes two sets of bias current generators. The first set, referred to as the set 610 of master bias generators includes a fixed (master) bias generator FBG 611, and three programmable master generators, PA-PBG (613), TX-PBG (615), and RX-PBG (617) for the power amplifier, transmitter front end, and receiver subsystems, respectively. Each master PBG in set 610 is controlled by the output—4-bits in one embodiment—of its respective function (e.g., ramp) generator. All the output currents of the fixed and programmable master generators are constant multiples of current $I_{REF}$, which in one embodiment is an M'th of the current sourced by an $I_{REF}$ pin 619 into off-chip resistor $R_{REF}$ (425).

Each of the second set (set 620) of current generators is referred to as a slave bias generator. In one embodiment, all the slave generators are programmable bias current generators such as slave PBG 603. In another embodiment, the second set 620 of slave generators also includes one or more fixed bias generators (FBGs) such as slave FBG 623. The outputs of these fixed and programmable slave generators supply individual analog subcircuits.

A set of (one or more) slave PBGs 631 provides bias current to the subcircuits of the receiver subsystem, another set 633 of (one or more) slave PBGs provides bias current to the subcircuits of the transmitter front-end, and yet another set of (one or more) slave PBGs 635 provides bias current to the subcircuits of the power amplifier subsystem 208. Other FBGs or PBGs provide currents to the phase lock loop oscillator components, ADCs, DACs and other analog subcircuits. In one embodiment, each of the slave FBGs and slave PBGs has an enable input and a current input that is supplied by one of the outputs of the master bias generators. In one embodiment, the programmable slave generators have 4-bit digital control inputs from the digital system processor 442.

In one embodiment, the enable inputs of some but not necessarily all slave generators are driven by enable circuits 625. Each enable circuit 625 has four control inputs, TX_En, RX_En, MASTER_En, and DEFAULT_En, that come from registers in the digital system processor 442 referred to as bias enable registers herein, and two inputs, TX_is_on and RX_is_on, that come from the TX and RX function generators, respectively. The logic function that is performed by the enable circuits 625 is $EN=(((TX\_is\_on.\text{AND}.TX\_En).\text{OR}.(RX\_is\_on.\text{AN-}$
$\text{D}.RX\_En)).\text{AND}.\text{MASTER}\_En).\text{OR}.$
$\text{DEFAULT}\_En$ Setting the DEFAULT_En bit 'on' permanently enables a subcircuit being supplied by a slave bias generator, regardless of the state of the other control bits. Setting the MASTER_En bit 'off' permanently disables the subcircuit if the DEFAULT_En bit is 'on'. Setting the TX_En bit 'on' with the MASTER_En bit 'on' and the DEFAULT_En 'bit' off enables the subcircuit during transmit. Setting the RX_En bit high with the MASTER_En bit 'on' and the DEFAULT_En bit 'off' enables the subcircuit during receive.

All RX_on inputs of the enable circuits are driven by the trigger output of RX-FG 605. The TX_is_on inputs of the power amplifier enable circuits are driven from the PA_is_on trigger output of PA-FG 609. All other enable circuit TX_is_on inputs are driven from the TX_is_on trigger output of TX-FG 607.

According to one aspect of the invention, the amount of bias from each of programmable slave generators 631 to at least some of the subcircuits in the receiver RF electronics subsystem 210 are controlled by values in registers (called the bias control registers) of the set 437 of registers of the digital system processor 442. The amount of bias from programmable slave generator 632 to the LNA 206 also is controlled by values in the bias control registers of the digital system processor 442. Furthermore, the amount of bias from each of programmable slave generators 633 to each of the subcircuits in the transmitter front end 211 also is controlled by values in the bias control registers of the digital system processor 442. Furthermore, the amount of bias from each of programmable slave generators 635 to the power amplifier subsystem 208 also is controlled by values in the bias control registers of the digital system processor 442.

In one embodiment, the power amplifier subsystem bias is set by one of nine 4-bit bias settings. The setting selected is controlled by a PA bias source select bit and the three-bit PA bias mode select lines that are fed to the transceiver chip, for example from the modem chip. When the source select bit is clear, a default bias setting is used. When the source select bit is set, one of the 8 bias settings from PA mode registers that are part of register set 437 is used depending on the mode select lines. These are driven from either the mode select bits from the gain control interface if it is enabled, or from the PA mode select register if the gain control interface is disabled.

The power supply also includes a programmable common mode voltage supply 630 for both the receiver baseband subcircuits and the transmitter baseband subcircuits. Tx $V_{CM}$ select signals 641 from the transmitter baseband filter control register select one of four common mode voltages from a bias voltage generator 645 for the transmitter baseband subcircuits, and Rx $V_{CM}$ select signals 643 from the receiver baseband filter control register select one of four common mode voltages from the bias voltage generator 645 for the receiver baseband subcircuits.

Programmable Chip Aspects

Yield Enhancement by Programmability

With CMOS, it is difficult to achieve accurate analog circuits that will meet typically tight specifications chip-to-chip and batch-to-batch, e.g., production batch-to-production batch due to, for example, process variability. This is one reason typical yields are sometimes low for prior art CMOS analog circuits that are required to have tightly controlled performance parameters. One aspect of the invention is a method of increasing the yield of producing transceiver chips by including a programmable bias supply on each transceiver chip that provides for adjusting the bias of at least some of the individual subcircuits on each chip. In one embodiment, the programmable bias supply 440 is designed such that the bias programmability is greater than the process spread for the fabrication process. The yield is increased by programming the programmable bias supply to supply bias currents to the subcircuits in the chip such that the chip meets specification for chips that otherwise might fall outside of specification. Thus, the performance of transceivers in individual batches, indeed individual chips, may be programmed to be within the specification by modifying the bias settings of bias to the subcircuits.

In one embodiment, batches are sampled, e.g., each chip production batch is sampled, and the correct bias settings determined by an experiment. A system such as that shown in FIG. 2 is used to carry out the experiment. A calibration program is downloaded via the transceiver SPI to the transceiver chip using a host processor. The bias settings that are required for the chip of a batch to meet specification may then be determined by the experiment. Each individual chip of the batch may then be programmed by programming the programmable bias supply according to the results of the experiment.

In one embodiment, a set of batch types are identified. The fabricated chips are tested and assigned to one of the batch types according to the test results. The set of required bias programming for each batch type is published as part of the specifications. The required bias settings for each chip may then be set according to the batch type.

In an improved embodiment, the required bias settings are determined for each transceiver chip by running the transceiver chip in a calibration mode. In calibration mode, a digital processor (e.g., processor 442) in each transceiver chip carries out a calibration method to determine the bias settings that bring the individual transceiver chip within specification. In one embodiment, the digital processor in calibration mode runs one or more provided automatic calibration programs in order to determine the bias settings. A system such as that of FIG. 2 together with test signals may be used to carry out the calibration.

Various elements such as the variable gain amplifiers in the embodiment of FIG. 4B also have programmable gain (or attenuation) levels. Thus, the gain of one or more stages of the receiver subsystem 415 may be set by the digital controller 442, and the gain of one or more stages of the transceiver front end 211 also can be set by the digital controller 442. In accordance with another aspect, the yield is increased by programming the programmable gains of one or more subcircuits in the chip such that the chip meets specification for chips that otherwise might fall outside of specification. Thus, the performance of transceivers in individual batches, indeed individual chips, may be programmed to be within the specification by modifying the gain settings of gains of one or more subcircuits.

The gains may be set off-chip using the gain control interface 482. Thus, in one embodiment, chip batches are sampled and the correct gain settings determined by an experiment using a system similar to that shown in FIG. 2. In one embodiment, a set of batch types are identified and chip gains are tested and assigned to one of the batch types according to the test results. The set of required gain settings for each batch type is published as part of the specifications. The required bias settings for each chip may then be set according to the batch type.

In an improved embodiment, the required gain settings are determined for each transceiver chip by running the transceiver chip in a calibration mode.

Dynamic Power Control by Controlling the Bias of the Power Amplifier(s)

According to another aspect of the invention, the programmable bias supply is used to program different bias levels to the different subcircuits to achieve different performance levels, e.g., different SNR and different power dissipation. This can be done dynamically.

Thus, one embodiment of the invention is a transceiver chip that includes a programmable bias supply, the transceiver having programmable power consumption by modifying the bias supplied to the power amplifier subsystem 208, for example for reducing the power consumption of the transceiver chip. In general, when the bias current is reduced, not only the gain, but also the power consumption of a stage is reduced.

In one embodiment of the invention the bias current for each of the subsystems of the transceiver chip is matched to the particular application. For example, the IEEE 802.11a standard provides for different data rates using different modulation schemes. A prior art transceiver not having programmable bias for individual subcircuits but conforming to the IEEE 802.11a standard therefore would be designed to perform well for all the different rates. When operating in a low-rate application, for example using BPSK modulation, the power consumption of such a non-programmable design would be the same as when operating for high rate application, say using 64QAM modulation. 64 QAM modulation typically requires about 10 dB power handling over the average power, whereas BPSK typically only requires about 2 or 3 dB extra power handling capability. Such a non-programmable transceiver would be wasting power when transmitting BPSK signals.

One embodiment is an adaptive method for transmitting signals that have one of a set of properties, e.g., one of a set of modulation schemes from a transceiver that includes a programmable bias supply that provides programmable bias settings for the power amplifier subsection 208. The method includes determining the modulation scheme and programming the bias supply to bias the power amplifier subsection 208 for a setting matched to one or both of the modulation and the data rate of the signals. When the signals are IEEE 802.11a conforming signals, each frame includes information on the data rate and thus the modulation used. A radio controller such as the modem 212 of FIG. 3 working together with the transceiver ship determines the modulation. In one embodiment, the radio controller uses the gain control interface that provides for setting the power amplifier subsystem bias as one of nine 4-bit bias settings. Which of these nine settings is selected is controlled by the PA bias source select bit and the three-bit PA bias mode select lines of the gain control interface that are fed to the transceiver chip, for example from the modem chip. When the source select bit is clear, a default bias setting is used. When the source select bit is set, one of the 8 bias settings from PA mode registers that are part of register set 437 is used depending on the mode select lines. Each of the registers is pre-programmed to apply a bias setting that matches the modulation. In this way, the power consumption of the power amplifier subsection 208, and hence of the transceiver chip, adapts to the type of signal being transmitted so that the power consumption is kept relatively low.

While the above describes a method of transmitting with power levels matched to the modulation scheme, the method may be extended to transmitting with power levels matched to one or more properties of the signals, including the modulation scheme.

Programming to Achieve Different Performance Characteristics

According to another aspect of the invention, the programmable bias supply is used to program different bias levels to the different subcircuits in the receiver subsection or the transmitter subsection or both to achieve different performance levels, e.g., different SNR and different power consumption levels.

One aspect is varying the characteristics of the low-noise amplifier (LNA) 206 in the receiver subsystem of the transceiver. The gain of the low-noise amplifier (or amplifiers) of the receiver subsection may be varied by varying the bias. As an example, suppose the receiver is known to be operating in a high interference environment. In such a situation, one aspect of the invention includes adjusting the bias to the low noise amplifier by programming the programmable bias supply to achieve a higher dynamic range, so that the LNA is less sensitive to interference. In general, increasing the bias current of the LNA increases the dynamic range. Both the compression point of the gain characteristics and the gain itself increase with bias current, but the gain increases much less than does the dynamic range. Another example of when a higher dynamic range may be desired is when it is known that there are both nearby transmitters and faraway transmitters transmitting to the receiver. A high dynamic range is desired to deal with the varying received signal strengths.

An example of when the LNA might be adjusted to perform in a high sensitivity mode is for a point-to-point application, such as when the transceiver chips are used in a WLAN, between, say a workstation and a printer or other peripheral device. Another example is a true "point-to-point" application, e.g., an outdoor application with proper antennas in a point-to-point link. By setting the LNA to be very sensitive, the gains and hence the power consumption in the rest of the transceiver chip may be reduced significantly.

Thus, one aspect of the invention is a transceiver that may be programmed for different types of performance. A transceiver chip may be programmed for high dynamic range, another for low noise figure, another for a wide temperature range, and yet another for low power performance. A different set of bias settings is provided for each type of performance. Thus, the same chip may be made for each different situation. Since the marginal cost of a chip is small compared to the design costs, using the same chip that may be programmed for different performance levels is very desirable.

Note that the gains of one or more subcircuits may be set to provide for different performance types. Thus, in one embodiment, a set of gain settings is provided for each type of performance and in another embodiment, sets of both gain and bias settings are provided for each performance type.

Dynamic Control to Provide Different Receiver Performance Characteristics

In an improved implementation, the bias setting or settings, e.g., the LNA 208 bias setting(s), are dynamically set. In one embodiment, this is done according to the received signal. One embodiment of the receiver subsection of the transceiver includes a received signal strength indicator (RSSI) output, for example using the log detector 430 of FIG. 4B may be used to determine the received signal power. For example, the transceiver chip may be used in conjunction with the modem shown in FIG. 3. Modem 212 includes an ADC 303 for measuring the RSSI. On the basis of the received power, the modem may send commands via the transceiver SPI to program the programmable bias generator to set the bias setting of the LNA to a value that provides characteristics suitable for the received signal. In an alternate embodiment a host processor (see FIG. 2) may be used if there is enough time for the RSSI determination and bias setting.

In one implementation, pre-computed lookup tables of bias settings for different signal strengths are stored. These lookup tables may be stored in the radio controller (modem) that is to operate with the transceiver, and map the signal strength measurement into bias control register values to use to achieve a desired criterion, such as high (e.g., maximum) signal-to-noise-plus-distortion at each stage in the radio. The lookup tables may be modified to account for process variations, temperature, and so forth.

The gains also may be set off-chip using the gain control interface 482. This is used, for example, to achieve automatic gain control based on signal strength measurement. In one implementation, pre-computed lookup tables of gain settings for different received signal strengths also are stored. These lookup tables may be stored in the radio controller (modem) that is to operate with the transceiver, and map the signal strength measurement into gain control bits for the transceiver to use to achieve a desired criterion, such as high (e.g., maximum) signal-to-noise-plus-distortion at each stage in the radio. These lookup tables also may be modified to account for process variations, temperature, and so forth.

Dynamic Control to Account for Temperature Differences

With CMOS, digital processing comes relatively inexpensively. That is, by incorporating at least one analog-to-digital converter (ADC) and at least one digital-to-analog (DAC) on-chip together with digital processing, compensating for various effects may be carried out dynamically to compensate for variations, including process spread variations and other variations.

One aspect of the invention is gain-temperature control. One embodiment of the transceiver chip is required to operate over a very broad temperature range, e.g., from −40° C. to +85° C. One embodiment includes an on chip temperature sensor 439 (FIGS. 4A and 4B, FIG. 7) coupled to an ADC 703 to measure the temperature, and a processor 442 (FIGS. 4A and 4B, FIG. 7). One embodiment of the sensor includes two or more PN diode junctions in series. A fixed bias current is applied to the PN junctions. The voltage across the junctions provides a measure of temperature that is digitized with the on-chip ADC 703. For n-junctions in series, the voltage is known to vary approximately −2 n mV per ° C., so there is a monotonic relation between temperature and the measured voltage across the junctions.

The gains of the amplifiers, for example, the low noise amplifier (LNA) 206 drop with temperature. The gain furthermore is adjustable by adjusting the bias level. So providing a programmable bias supply and on-chip temperature sensing together with the processor 442 provides for adjusting the bias levels dynamically so that the gains are always sufficient to meet the required specification. In one embodiment of the program, the processor 442 is programmed to interrupt to a gain-temperature control service routine stored in the RAM of the processor 442 whenever the temperature rises to a level that is some pre-set increment, e.g., $\Delta T° C._1$, above the temperature at the previous time the gain-temperature routine was run. So when the temperature rises $\Delta T° C._1$ from the last value, a flag is set, and the flag in turn causes an interrupt to a routine on the processor that sets the bias levels on the programmable bias supply according to a pre-stored lookup table.

According to an alternate embodiment, the interrupt to the gain-temperature control routine occurs when the temperature reaches some preset level.

In general, the gain of a stage varies as the bias current and inversely with temperature, so that as the temperature raises, the bias current needs to be increased to increase the gain to compensate for the fall in gain due to the temperature rise.

Note that in one embodiment, the gain settings for the stages in the radio are set by the interrupt routine to account for gain variations with temperature, and in another embodiment both the bias levels and the gain settings are modified by the interrupt service routine.

Furthermore, the VCO frequencies may vary as temperature varies. One transceiver embodiment includes VCOs that are programmable and may be calibrated. See for example, U.S. patent application Ser. No. 09/952,925 to Adams, et al., entitled REPLICA CHARGE-PUMP AND VOLTAGE-CONTROLLED OSCILLATOR CALIBRATOR, filed Sep. 14, 2001, Attorney/Docket number CISCO-4930, assigned to the assignee of the present invention, for a description of an on-chip calibration apparatus that is incorporated in one version of the transceiver, and a method for using the calibrator. U.S. application Ser. No. 09/952,925 is incorporated herein by reference. Another aspect of the invention is the use of the on-chip temperature sensor to automatically trigger a re-calibration of the VCO, so that the chip remains within specification using programmability. Whenever the temperature rises to a level that is some preset increment, e.g., $\Delta T_2° C.$ above the temperature at the previous VCO calibration time, a VCO calibration flag is set that in turn causes an interrupt to a VCO calibration routine on the processor that re-calibrates the on-chip VCOs.

Furthermore, the transceiver uses filters that may need to be calibrated from time to time, for example the baseband analog filters 418 and 420 in the receiver RF electronics subsystem 210 and the baseband analog filters 444 and 446 on the transmitter front end 211. Another aspect of the invention is the use of the on-chip temperature sensor to automatically trigger a re-calibration of the filters, so that the chip remains within specification using programmability. Whenever the temperature rises to a level that is some preset increment, e.g., $\Delta T_3° C.$ above the temperature at the previous filter calibration time, a filter calibration flag is set that in turn causes an interrupt to a filter calibration routine on the processor that re-calibrates the on-chip filters.

Note that in alternate embodiments, the interrupts may occur at temperature values rather than when an incremental temperature rise is detected. Furthermore, in embodiments that include a processor that does not have an interrupt mechanism, alternate mechanisms may be used to run the calibration programs.

Note that in general, how frequently any of the programmable changes to the transceiver chip take place depends on the process characteristics. Different foundries may produce chips that require different sets of parameters even when incorporated in identical system designs.

The above embodiments have been described in the context of an RF transceiver chip that includes a transmitter subsection and a receiver subsection. The invention, however is not restricted to such RF devices, and may be applied to a receiver device or a transmitter device. Furthermore, the device may contain more or fewer of the subsections of the embodiments described herein. For example, one chip embodiment may include the transceiver functions of FIG. 4B and some or all of the modem functions shown in FIG. 3 on the same substrate.

Thus, while some embodiments, contexts, and applications have been described herein, the invention is not limited to those embodiments, contexts, and applications.

By the terms "analog circuit" and "analog subcircuit" is meant a circuit that is substantially analog, so is required to be accurate. Such analog circuits or subcircuits may accept or output one or more digital signals. Such analog circuits or subcircuits include, for example, circuits for processing an analog signal to produce another analog signal, e.g., amplifiers, mixers, filters, and so forth. While being substantially analog, such analog processing circuits could, for example, have digital inputs that control the gain or other properties. The term "analog circuit" also covers analog to digital converters and digital to analog converters.

While one embodiment includes a digital subsection that has a programmable microcontroller (e.g., a microprocessor) with a RAM for program storage for controlling aspects of the chip including the programmable bias supply, other embodiments may include another type of digital subsection that does not use a programmable processor and RAM, for example a digital control circuit.

Furthermore, while one embodiment includes partitioning the transceiver one way into subcircuits that are supplied by programmable elements in the programmable bias supply, different partitioning may be used, with a different number of bias current supplies with a different number of programmable elements.

Embodiments described herein include a main bias current generator whose current is set by an external resistor. Other embodiments may use a different main bias generator, not necessarily set by an external resistor.

Furthermore, while one embodiment includes both a main generator to supply a reference current, a programmable master generator that may be modulated by a function generator, and one or more slave generators, at least one of which may be programmable, in other embodiments that do not include time modulation, e.g., ramp modulation of the bias current, the main bias generator may be the master bias generator to which the slave bias generators are connected and that supplies a reference current to the slave bias generators.

While one transceiver embodiment of the invention includes a superheterodyne receiver and a superheterodyne transmitter, other transceiver architectures may also benefit from the invention. For example, more or less than two oscillators may be present.

Furthermore, while, one transceiver embodiment of the invention is for half-duplex operation, the invention is not restricted to any particular mode of operation. Other modes of operation, including, for example, TDMA half-duplex and TDMA full-duplex may benefit from the invention.

While a transceiver embodiment for operation with RF frequencies in the 5 GHz range has been described, the invention may be embodied in transceivers operating in other RF frequency ranges. Furthermore, while a transceiver embodiment for operation conforming to the IEEE 802.11a standard has been described, the invention may be embodied in transceivers conforming to other standards and for other applications, including, for example, the IEEE 802.11b standard, other WLAN standards, bluetooth, GSM, PHS, and other cellular wireless telephony standards. Applications that can be accommodated by RF transceiver 205 are IEEE 802.11a COFDM wireless LANs and links, wireless Ethernet, Hiperlan I, Hiperlan II, European Technical Standards Institute (ETSI) broadband radio access network (BRAN), and multimedia mobile access communication (MMAC) systems, wireless local area networks, local multipoint distribution service (LMDS) IF strips, wireless digital video, wireless USB links, wireless IEEE 1394 links, TDMA packet radios, low-cost point-to-point links, voice-over-IP portable "cell phones" (wireless Internet telephones), etc.

Furthermore, while embodiments described herein are for an integrated circuit that includes MOS transistors, the invention is not restricted to MOS transistor circuits. Furthermore, while CMOS embodiments are described herein, the invention is not restricted to a CMOS integrated circuit.

Thus, while there has been described what is believed to be the preferred embodiments of the invention, those skilled in the art will recognize that other and further modifications may be made thereto without departing from the spirit of the invention, and it is intended to claim all such changes and modification as fall within the scope of the invention.

What is claimed is:

1. A radio frequency (RF) integrated circuit comprising:
   a substrate;
   a set of one or more analog subcircuits on the substrate; and
   a programmable bias current supply on the substrate coupled to the subcircuit set to provide bias currents to the analog subcircuits, including providing programmable bias current to each of one or more analog subcircuits forming a first subset of the set,
   such that one or more characteristics of the RF integrated circuit are modifiable by programming the programmable bias supply,
   wherein the integrated circuit is for operation as a radio transceiver including a receiver and a transmitter,
   wherein the subcircuit subset includes a power amplifier in the transmitter, and
   wherein the programmable bias supply is to set the bias of the power amplifier to achieve different power consumption and performance.

2. An integrated circuit as described in claim 1,
   wherein the receiver includes a low noise amplifier and wherein the subset includes the low noise amplifier and none or more other analog subcircuits of the receiver,
   such that the programmable bias supply is further to set the bias supplied to the low noise amplifier and none or more other analog subcircuits of the receiver.

3. An integrated circuit as described in claim 2, wherein the transceiver is for operation in any of a plurality of applications, and wherein the bias supply is programmable to match the application, such that when operating the integrated circuit in a particular application, the bias current for at least one of the subset of subcircuits is matched to the particular application.

4. An integrated circuit as described in claim 3, wherein the plurality of applications includes two or more of a high dynamic range application, a low noise figure, a wide temperature range application, and a low power application.

5. An integrated circuit as described in claim 1, wherein the transmitter is for transmitting signals having one of a plurality of properties, and wherein the bias supply provides a plurality of bias settings for the power amplifier, each setting matched to one of the signal properties, such that when transmitting, the integrated circuit transmits at a power setting matched to the signal being transmitted.

6. An integrated circuit as described in claim 5, wherein the plurality of properties include a plurality of modulation schemes, such that when transmitting, the integrated circuit transmits at a power setting matched to the modulation of the signal being transmitted.

7. An integrated circuit as described in claim 5, wherein the integrated circuit is for operation as a transceiver in a local area network conforming to one of the IEEE 802.11 standards, wherein the transceiver is for operation with a modem coupled to the receiver and the transmitter, the modem to determine the modulation scheme of a received signal from one or more signals received at the receiver and to provide an indication to the programmable power supply of the determined modulation scheme, such that when transmitting, the transmitter transmits at a power setting matched to the determined modulation scheme.

8. An integrated circuit as described in claim 5, further comprising:
   a digital controller coupled to the programmable bias supply to set the bias current supplied to one or more of the subcircuits, the controller including one or more bias control registers,
   wherein the bias current to the power amplifier is determined by the contents of at least one of the bias control registers.

9. An integrated circuit as described in claim 8, wherein the controller includes a power amplifier mode register, and wherein the contents of the mode register select one of a plurality of pre-defined power amplifier bias settings.

10. A radio frequency (RF) integrated circuit comprising:
    a substrate;
    a set of one or more analog subcircuits on the substrate;
    a programmable bias current supply on the substrate coupled to the subcircuit set to provide bias currents to the analog subcircuits, including providing programmable bias current to each of one or more analog subcircuits forming a first subset of the set; and
    a digital controller coupled to the programmable bias supply to set the bias current supplied to each of the one or more analog subcircuits of the first subset,
    such that one or more characteristics of the RF integrated circuit are modifiable by programming the programmable bias supply,
    wherein the integrated circuit is for operation as a radio transceiver including a receiver and a transmitter, the receiver including one or more receive analog subcircuits, and the transmitter including one or more transmit analog subcircuits,
    wherein the subset includes at least one of the receive analog subcircuits, such that the digital controller is to set the bias supplied to at least one of the receive analog subcircuits, and
    wherein the transceiver is for operation in any of a plurality of applications, including different data rates and/or different modulation methods, and wherein the bias supply is programmable to match the data rate and/or modulation method, such that when operating the integrated circuit in a particular application, the bias current for at least one of the subset of subcircuits is matched to data rate and/or modulation method for the particular application.

11. A radio frequency (RF) integrated circuit comprising:
a substrate;
a set of one or more analog subcircuits on the substrate;
a programmable bias current supply on the substrate coupled to the subcircuit set to provide bias currents to the analog subcircuits, including providing programmable bias current to each of one or more analog subcircuits forming a first subset of the set; and
a digital controller coupled to the programmable bias supply to set the bias current supplied to each of the one or more analog subcircuits of the first subset,
such that one or more characteristics of the RF integrated circuit are modifiable by programming the programmable bias supply,
wherein the integrated circuit is for operation as a radio transceiver including a receiver and a transmitter, the receiver including one or more receive analog subcircuits, and the transmitter including one or more transmit analog subcircuits,
wherein the subset includes at least one of the receive analog subcircuits, such that the digital controller is to set the bias supplied to at least one of the receive analog subcircuits, and
wherein the receive analog subcircuits include a low noise amplifier, and wherein the programmable bias supply is to set the bias supplied to the LNA, wherein one or more of the gain of the LNA and/or the dynamic range of the LNA are changed by changing the setting of the bias supplied to the LNA.

12. An integrated circuit as described in claim 11, wherein the transceiver is for operation in any of a plurality of applications, and wherein the bias supply is programmable to provide bias current to the LNA to match the application, such that when operating the integrated circuit in a particular application, the bias current for the LNA is matched to the particular application.

13. An integrated circuit as described in claim 12, further comprising:
a digital controller coupled to the programmable bias supply to set the bias current supplied to one or more of the subcircuits, the controller including one or more bias control registers,
wherein the bias current to the LNA is determined by the contents of one of the bias control registers.

14. A radio frequency (RF) integrated circuit comprising:
a substrate;
a set of one or more analog subcircuits on the substrate;
a programmable bias current supply on the substrate coupled to the subcircuit set to provide bias currents to the analog subcircuits, including providing programmable bias current to each of one or more analog subcircuits forming a first subset of the set; and
a digital controller coupled to the programmable bias supply to set the bias current supplied to each of the one or more analog subcircuits of the first subset, wherein the controller includes one or more bias control registers,
such that one or more characteristics of the RF integrated circuit are modifiable by programming the programmable bias supply,
wherein the integrated circuit is for operation as a radio transceiver including a receiver and a transmitter, the receiver including one or more receive analog subcircuits, and the transmitter including one or more transmit analog subcircuits,
wherein the subset includes at least one of the receive analog subcircuits, such that the digital controller is to set the bias supplied to at least one of the receive analog subcircuits,
wherein the receive analog subcircuits include a low noise amplifier, and wherein the programmable bias supply is to set the bias supplied to the LNA, and
wherein the transceiver is for operation in any of a plurality of applications, and
wherein the bias supply is programmable to provide bias current to the LNA to match the application, such that when operating the integrated circuit in a particular application, the bias current for the LNA is matched to the particular application,
wherein the bias current to the LNA is determined by the contents of one of the bias control registers, and
wherein the receiver includes a detector coupled to the controller to provide a received signal strength indication and wherein the controller is to set the bias current supplied to the LNA according to the received signal strength indication.

15. An integrated circuit as described in claim 14, wherein the coupling between the detector and the controller is via a modem coupled to the receiver.

16. An integrated circuit as described in claim 15, wherein the modem is to store pre-computed lookup tables to provide pre-computer bias settings for different received signal strength indications.

17. An integrated circuit as described in claim 16, wherein the lookup tables are modifiable to account for one or both of semiconductor process variation and expected operating temperature range.

18. An integrated circuit as described in claim 1,
wherein the programmable bias supply further includes:
a master bias generator having an output that supplies a reference current, and
one or more programmable slave current generators each having an input coupled to the output of the master bias generator, a digital input coupled to a digital controller and an output coupled to one or more of the subcircuits of the set of analog subcircuits.

19. An integrated circuit as described in claim 18, wherein the current output is determined by a reference resistor coupled to the master bias generator, and wherein selecting different values for the reference resistor provides for different power levels at the power amplifier.

20. An integrated circuit as described in claim 1, further comprising:
a digital controller coupled to the programmable bias supply to set the bias current supplied to one or more of the subcircuits.

21. An integrated circuit as described in claim 20, wherein the controller includes one or more bias control registers, and wherein the bias current to the one or more of the analog subcircuits is determined by the contents of the bias control registers.

22. An integrated circuit as described in claim 20, wherein the controller includes a power amplifier mode register, and wherein the contents of the mode register selects one of a plurality of pre-defined power amplifier bias settings.

23. A method of producing radio frequency (RF) chips to meet a specification, comprising
fabricating the RF chips using a fabrication process,
wherein each RF chip includes:
a substrate;

a plurality of analog subcircuits on the substrate forming one or both of a set consisting of a receiver subsection and a transmitter subsection, wherein the receiver subsection includes a low noise amplifier;

a programmable bias supply on the substrate to provide an adjustable bias to one or more of the plurality of subcircuits, the programmable bias supply providing a bias programmability, wherein one or more of the gain of the LNA and/or the dynamic range of the LNA are changed by programming the programmable bias supply to adjust the bias supplied to the LNA, such that after fabrication, adjusting the programmable bias supply of at least some of the chips whose LNA has a gain and/or a dynamic range that otherwise might fall outside of the specification enables the chips to meet the specification.

24. A method of producing radio frequency (RF) chips to meet a specification, comprising:

fabricating the RF chips using a fabrication process, wherein each RF chip includes:

a substrate;

a plurality of analog subcircuits on the substrate forming one or both of a set consisting of a receiver subsection and a transmitter subsection;

a programmable bias supply on the substrate to provide an adjustable bias to one or more of the plurality of subcircuits, the programmable bias supply providing a bias programmability, such that after fabrication, adjusting the programmable bias supply of at least some of the chips whose performance otherwise might fall outside of the specification enables the chips to meet the specification, the method further comprising, after fabrication:

identifying a set of batch types;

testing the fabricated RF chips to assign each chip to one of the batch types;

for each batch type, performing a calibration experiment on at least one of the chips of the batch type to determine the bias settings that are required for the chip of the batch type to meet the specification; and for each batch type, providing the determined bias settings for adjusting the programmable bias supply of the chips of the batch type, such that the bias settings for a particular chip may then be set according to the batch type of the particular chip.

25. A method as described in claim 23, wherein each RF chip further includes:

a digital controller on the substrate coupled to the programmable bias supply to set the bias current supplied to each of one or more analog subcircuits of the plurality.

26. A method as described in claim 25, wherein each RF chip has a normal operating mode and a calibration mode embodiment, wherein the controller in calibration mode runs a calibration method to determine the bias settings that bring an individual transceiver chip within the specification.

27. A method as described in claim 23, wherein the analog subcircuit plurality includes subcircuits fabricated in a metal oxide semiconductor technology.

28. A method as described in claim 27, wherein the metal oxide semiconductor technology is CMOS technology.

29. A method of producing radio frequency (RF) chips to meet a specification, comprising:

fabricating the RF chips using a fabrication process, wherein each RF chip includes:

a substrate;

a plurality of analog subcircuits on the substrate forming one or both of a set consisting of a receiver subsection and a transmitter subsection;

a programmable bias supply on the substrate to provide an adjustable bias to one or more of the plurality of subcircuits, the programmable bias supply providing a bias programmability, such that after fabrication, adjusting the programmable bias supply of at least some of the chips whose performance otherwise might fall outside of the specification enables the chips to meet the specification, wherein each RF chip is for operation as a radio transceiver including a receiver and a transmitter, wherein the subcircuit plurality includes a power amplifier in the transmitter, and wherein the programmable bias supply is to set the bias of the power amplifier to achieve different power consumption and performance.

30. A method as described in claim 23, wherein each RF chip is for operation as a radio transceiver including a receiver and a transmitter, the receiver including one or more receive analog subcircuits, and the transmitter including one or more transmit analog subcircuits, and wherein the programmable bias supply is to set the bias supplied to at least one of the receive analog subcircuits.

31. A method as described in claim 30, wherein the receive analog subcircuits include a low noise amplifier, and wherein the programmable bias supply is to set the bias supplied to the LNA.

32. A method as described in claim 29, wherein the programmable bias supply further includes:

a master bias generator having an output that supplies a reference current, and one or more programmable slave current generators each having an input coupled to the output of the master bias generator, a digital input coupled to a digital controller and an output coupled to one or more of the subcircuits of the set of analog subcircuits.

33. A method as described in claim 32, wherein the current output is determined by a reference resistor coupled to the master bias generator, and wherein selecting different values for the reference resistor provides for different power levels at the power amplifier.

34. A method as described in claim 29, further comprising:

a digital controller coupled to the programmable bias supply to set the bias current supplied to one or more of the subcircuits.

35. A method as described in claim 34, wherein the controller includes one or more bias control registers, and wherein the bias current to one or more of the analog subcircuits is determined by the contents of the bias control registers.

36. A method as described in claim 34, wherein the controller includes a power amplifier mode register, and wherein the contents of the mode register select one of a plurality of pre-defined power amplifier bias settings.

37. A method of producing radio frequency (RF) chips to meet a specification, comprising fabricating the RF chips using a fabrication process, wherein each RF chip includes:

a substrate;

a plurality of analog subcircuits on the substrate including at least one variable gain subcircuit, the plurality forming one or both of a set consisting of a receiver subsection and a transmitter subsection;

a digital controller on the substrate coupled to the one or more variable gain subcircuits, the controller to set the gains of one or more variable gain subcircuits including to set the gain of at least one of the variable gain subcircuits by adjusting the bias setting to the at least one variable gain subcircuit, such that after fabrication, adjusting the gain settings of at least some of the chips whose performance otherwise might fall outside of the specification enables the chips to meet the specification.

38. A method as described in claim 37, further comprising, after fabrication:

sampling batches of fabricated RF chips;

for each sampled chip of a batch, performing a calibration experiment to determine the gain settings that are required for the chip of the batch to meet the specification; and providing the determined gain settings for adjusting gain of the chips of the batch.

39. A method of producing radio frequency (RF) chips to meet a specification, comprising fabricating the RF chips using a fabrication process, wherein each RF chip includes:

a substrate;

a plurality of analog subcircuits on the substrate including at least one variable gain subcircuit, the plurality forming one or both of a set consisting of a receiver subsection and a transmitter subsection;

a digital controller on the substrate coupled to the one or more variable gain subcircuits, the controller to set the gains of one or more variable gain subcircuits, such that after fabrication, adjusting the gain settings of at least some of the chips whose performance otherwise might fall outside of the specification enables the chips to meet the specification, the method further comprising, after fabrication:

identifying a set of batch types;

testing the fabricated RF chips to assign each chip to one of the batch types;

for each batch type, performing a calibration experiment on at least one of the chips of the batch type to determine the gain settings that are required for the chip of the batch type to meet the specification; and for each batch type, providing the determined gain settings for adjusting the gain of the one or more variable gain subcircuits of the chips of the batch type, such that the adjustable bias for a particular chip may then be set according to the batch type of the particular chip.

40. A method as described in claim 37, wherein each RF chip has a normal operating mode and a calibration mode embodiment, wherein the controller in calibration mode runs a calibration method to determine the gain settings that bring an individual transceiver chip within the specification.

41. A method as described in claim 37, wherein the analog subcircuit plurality includes subcircuits fabricated in a metal oxide semiconductor technology.

42. A method as described in claim 41, wherein the metal oxide semiconductor technology is CMOS technology.

43. A method of producing radio frequency (RF) chips to meet a specification, comprising fabricating the RF chips using a fabrication process, wherein each RF chip includes:

a substrate;

a plurality of analog subcircuits on the substrate including at least one variable gain subcircuit, the plurality forming one or both of a set consisting of a receiver subsection and a transmitter subsection;

a programmable bias supply on the substrate to provide an adjustable bias to one or more of the plurality of subcircuits, the programmable bias supply providing a bias programmability; and a digital controller on the substrate coupled to the one or more variable gain subcircuits, the controller to the gain settings of one or more variable gain subcircuits, such that after fabrication, adjusting one or both of the programmable bias supply and the gain settings of at least some of the chips whose performance otherwise might fall outside of the specification enables the chips to meet the specification.

44. A method as described in claim 43, wherein the bias programmability is greater than the process spread for the fabrication process.

45. A method as described in claim 43, further comprising, after fabrication:

sampling batches of fabricated RF chips;

for each sampled chip of a batch, performing a calibration experiment to determine the bias settings that are required for the chip of the batch to meet the specification; and providing the determined bias settings for adjusting the programmable bias supply of the chips of the batch.

* * * * *